United States Patent
Wernet et al.

(10) Patent No.: US 10,439,337 B2
(45) Date of Patent: Oct. 8, 2019

(54) PLUG CONNECTOR

(71) Applicant: Endress + Hauser GmbH + Co. KG, Maulburg (DE)

(72) Inventors: Armin Wernet, Rheinfelden (DE); Gerd Bechtel, Steinen (DE); Dirk Schrank, Schopfheim (DE)

(73) Assignee: ENDRESS+HAUSER SE+CO. KG, Maulburg (DE)

( * ) Notice: Subject to any disclaimer, the term of this patent is extended or adjusted under 35 U.S.C. 154(b) by 0 days.

(21) Appl. No.: 14/910,763

(22) PCT Filed: Jul. 11, 2014

(86) PCT No.: PCT/EP2014/064948
§ 371 (c)(1),
(2) Date: Feb. 8, 2016

(87) PCT Pub. No.: WO2015/018597
PCT Pub. Date: Feb. 12, 2015

(65) Prior Publication Data
US 2016/0190749 A1   Jun. 30, 2016

(30) Foreign Application Priority Data
Aug. 7, 2013 (DE) .................. 10 2013 108 532

(51) Int. Cl.
*H01R 13/66* (2006.01)
*G01D 21/00* (2006.01)
(Continued)

(52) U.S. Cl.
CPC ......... *H01R 13/6691* (2013.01); *G01D 21/00* (2013.01); *G08B 21/185* (2013.01);
(Continued)

(58) Field of Classification Search
CPC .............. H01R 13/6691; H01R 13/665; H01R 13/6683; H01R 13/7175; G01D 21/00; G08B 21/185; H03K 19/21
See application file for complete search history.

(56) References Cited

U.S. PATENT DOCUMENTS 7,503,816 B2    3/2009  Blaak et al.
7,581,982 B2    9/2009  Mehnert
(Continued)

FOREIGN PATENT DOCUMENTS

CN    1953278 A    4/2007
CN    101385206 A   3/2009
(Continued)

OTHER PUBLICATIONS

Machine Translation of DE 10 2009 029042 A1 to English.*
(Continued)

*Primary Examiner* — James J Yang
(74) *Attorney, Agent, or Firm* — Bacon & Thomas, PLLC (57) ABSTRACT

In a plug connector for connecting a field device of automation technology to an energy supply and/or to an evaluation unit, the plug connector includes a connection plug (M12) for the field device, wherein the connection plug (M12) is composed, at least partially, of a transparent material, wherein at least four display elements (gn ye, ye, rd) are arranged in the connection plug (M12). A first display element (gn) signals operational readiness of the field device; second and third display elements (ye, ye) signal two antivalent switch outputs (MIN, MAX) of the field device; and a fourth display element (rd) signals a disturbance or malfunction of field device. A circuit (NOR, XNOR) is provided to detect a disturbance or malfunction of field
(Continued)

device based on the antivalent switch outputs (MIN, MAX) of the field device, and to activate fourth display element (rd) upon detection.

9 Claims, 7 Drawing Sheets

(51) Int. Cl.
  *G08B 21/18* (2006.01)
  *H01R 13/717* (2006.01)
  *H03K 19/21* (2006.01)

(52) U.S. Cl.
  CPC ....... *H01R 13/665* (2013.01); *H01R 13/6683* (2013.01); *H01R 13/7175* (2013.01); *H03K 19/21* (2013.01)

(56) References Cited

U.S. PATENT DOCUMENTS

| | | | |
|---|---|---|---|
| 7,668,685 B2 | 2/2010 | Kathan | |
| 9,224,317 B2 | 12/2015 | Lott | |
| 2005/0052083 A1* | 3/2005 | Hauf | H01H 9/167 307/10.1 |
| 2006/0061365 A1 | 3/2006 | Lee | |
| 2007/0184704 A1* | 8/2007 | Blaak | H01R 13/6633 439/354 |
| 2012/0105084 A1* | 5/2012 | Kittleson | G01N 33/0047 324/693 |

FOREIGN PATENT DOCUMENTS

| | | | | |
|---|---|---|---|---|
| CN | 202888533 U | 4/2013 | | |
| DE | 10150641 A1 | 10/2002 | | |
| DE | 102004014065 A1 | 10/2005 | | |
| DE | 202006004815 U1 | 7/2006 | | |
| DE | 102005049483 A1 | 4/2007 | | |
| DE | 102006005632 A1 | 8/2007 | | |
| DE | 102006006726 A1 | 8/2007 | | |
| DE | 102009029042 A1 * | 3/2011 | ............. | G01D 21/00 |
| DE | 202011106255 U1 | 12/2011 | | |
| DE | 102011076672 B3 | 12/2012 | | |
| EP | 1251596 A1 | 10/2002 | | |

OTHER PUBLICATIONS

English Translation of International Preliminary Report on Patentability, WIPO, Geneva, dated Feb. 18, 2016.
International Search Report EPO, The Netherlands, dated Nov. 5, 2014.
German Search Report, German PTO, Munich, dated Mar. 28, 2014.

* cited by examiner

| A | B | Y = A NOR B |
|---|---|---|
| 0 | 0 | 1 |
| 0 | 1 | 0 |
| 1 | 0 | 0 |
| 1 | 1 | 0 |

Fig. 6a

| A | B | Y = A XNOR B |
|---|---|---|
| 0 | 0 | 1 |
| 0 | 1 | 0 |
| 1 | 0 | 0 |
| 1 | 1 | 1 |

PLUG CONNECTOR

TECHNICAL FIELD

The invention relates to a plug connector for connecting a field device of automation technology, especially a limit level switch, to an energy supply and/or an evaluation unit.

BACKGROUND DISCUSSION

Applied in automation technology, especially in process automation technology, are field devices, which serve for determining and monitoring process variables. Examples of such field devices are fill level measuring devices, flow measuring devices, analytical measuring devices, pressure- and temperature measuring devices, moisture- and conductivity measuring devices, density and viscosity measuring devices. The sensors of these field devices register the corresponding process variables, e.g. fill level, flow, pH-value, substance concentration, pressure, temperature, moisture, conductivity, density and viscosity. A large number of such field devices are produced and sold by members of the firm, Endress+Hauser.

Produced and sold by the applicant under the marks, LIQUIPHANT, LIQUIPOINT and SOLIPHANT, are sensors for detecting a predetermined fill level. They are preferably applied as running dry protection for pumps or as overfilling preventers and have usually two antivalent switch outputs, via which the particular switch state of the field device is output. These sensors, which are also referred to as limit level switches, have for reasons of leak proofing and/or space saving often no integrated optical displays (LED) for the two antivalent switch outputs. Especially is this the situation in the case of encapsulated field devices, which satisfy the IP69K standard. Since the on-site information concerning the respective switch output, respectively switch state of the limit level switch, is usually, however, very important for a customer, LEDs, which visualize the switch outputs, are integrated in the connection plug of the plug connector connected with the sensor. Used as connection plug in automation technology are often M12 plugs. The connection plugs offered in the market for field devices are, indeed, able, via LEDs, to visualize the two antivalent switch outputs and the operating voltage; however, they are not able, supplementally, to indicate disturbances or malfunctions of the field device on-site (thus at the site of integration into the process). Thus, extremely important on-site information is missing for customers operating a plant, in which the field device is installed. The disadvantage in the case of the known embodiment of the connection plug is especially that a defective or malfunctioning working field device can only be replaced with a more or less large time delay, since a technician cannot detect the disturbance or malfunction directly on-site. The ability of the plant to function can, consequently, in given cases, be significantly degraded due to malfunction of a field device.

SUMMARY OF THE INVENTION

An object of the invention is to provide a field device, which displays a disturbance or malfunction on-site.

The object is achieved by a plug connector for connecting a field device of automation technology to an energy supply and/or to an evaluation unit, wherein the plug connector comprises a connection plug for the field device, wherein the connection plug is composed, at least partially, of a transparent material, wherein at least four display elements are arranged in the connection plug, wherein a first display element signals operational readiness of the field device, wherein a second and a third display element signal two antivalent switch outputs (in the case of a limit level switch, one speaks of MAX and MIN safety) of the field device, wherein a fourth display element signals a disturbance or malfunction of field device, wherein a circuit is provided, which is so embodied that a disturbance or malfunction of field device is detected based on the antivalent switch outputs of the field device and in the case of detecting a disturbance or malfunction the fourth display element is activated. The display elements are preferably LEDs.

In order to integrate besides display of the operating voltage and the antivalent switch outputs also a disturbance or error signal in the connection plug of the field device, there occurs according to the invention a logic interconnecting of the two switch outputs. Since the dimensions of the connection plug are relatively limited, in the case e.g. of a LIQUIPHANT device, only a circuit with as few components as possible can be applied.

According to the invention, the antivalent switch outputs are considered, in order to detect a disturbance or malfunction on-site. Depending on switch output—MIN or MAX safety—, a switch output is switched or not in the case of covered limit level switch. In conventional connector plugs in the case of occurrence of a disturbance or malfunction, the two corresponding LEDs, which light in yellow color, are switched off, and only the green LED, which displays the presence of the operating voltage, lights. It is questionable, whether this LED circuitry suggests disturbance or malfunction to operating personnel. According to the invention, the disturbance or malfunction is signaled unmistakably and unequivocally: If there is a disturbance or malfunction, such is displayed by lighting up an additional, red LED at the location of installation of the field device.

Operation of the field device is displayed by continuous lighting of a first LED, usually a green LED. In the case of correct operation of the field device, the two antivalent switch outputs cause the second or the third LED (usually they are, in such case, yellow LEDs) to light. If the two yellow LEDs are switched off, a situation which according to the invention is interpreted as disturbance or malfunction, an additional LED lights. Usually, it is, in such case, a red LED.

In an advantageous embodiment of the plug connector of the invention, identification of a disturbance or malfunction in the field device is implemented via a NOR or XNOR circuit integrated in the plug. In such case, the XNOR circuit is the safer variant, because also the state, in which the two antivalent switch outputs MIN and MAX are switched simultaneously, is interpreted not as a normal operating state, but, instead, as a disturbance or malfunction. However, conventional implementations of these circuits in the case of connector plugs for field devices with small dimensions are not practical. For example, a construction in CMOS technology would exceed the space requirement in the case of usual limit level switches.

Nevertheless, depending on applied connection plug, a first embodiment provides that the logic circuit is implemented in CMOS technology. Moreover, it is provided that the logic circuit is implemented with an integrated gate. Preferably, the logic circuit is implemented in an integrated circuit chip.

An advantageous further development of the plug connector of the invention provides a logic circuit with a switch element, wherein the switch element is so embodied that, in the case of occurrence of a disturbance or malfunction, which is detected based on the connected antivalent switch outputs, it activates the fourth display element connected downstream.

Especially favorable in connection with the invention is when the switch element is a bipolar transistor, especially a PNP transistor, in whose base branch the second display element and the third display element are connected in parallel and in whose collector branch the fourth display element is arranged, wherein the transistor is so embodied that it blocks in normal operation and conducts in the case of occurrence of a disturbance or malfunction.

Moreover, it is provided that the logic circuit is so embodied that the second display element and the third display element are connected in parallel and the fourth display element is connected in series with the second and the third display element, that in normal operation the voltage on a node lying between the two parallel connected display elements and the fourth display element is sufficiently low that the fourth display element is deactivated, and that in the case of occurrence of a disturbance or malfunction the potential on the node is sufficiently high that the fourth display element is activated.

An advantageous embodiment of the solution of the invention provides that a protective diode, especially a Zener diode, is provided at least in the anode branch of the fourth light-emitting diode.

BRIEF DESCRIPTION OF THE DRAWINGS

The invention will now be explained in greater detail based on the appended drawing, the figures of which show as follows.

DETAILED DESCRIPTION IN CONJUNCTION WITH THE DRAWINGS

Figure 1A:
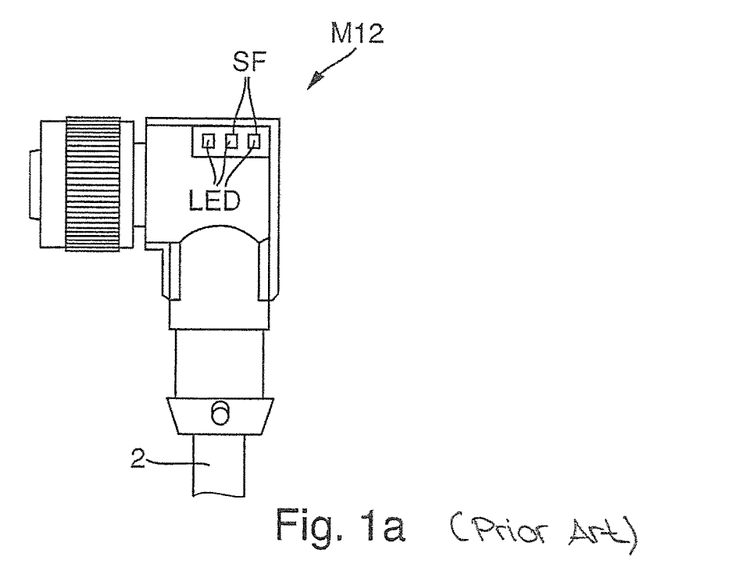
FIG. 1a a side view of a known connection plug M12 for a field device.

FIG. 1a shows a prior art connection plug M12 of a plug connector for a field device. The plug connector of the invention, comprising a connection plug M12 and cable 2, connects a field device (not shown) with an energy supply (not shown) and/or an evaluation unit (not shown).

Figure 1B:
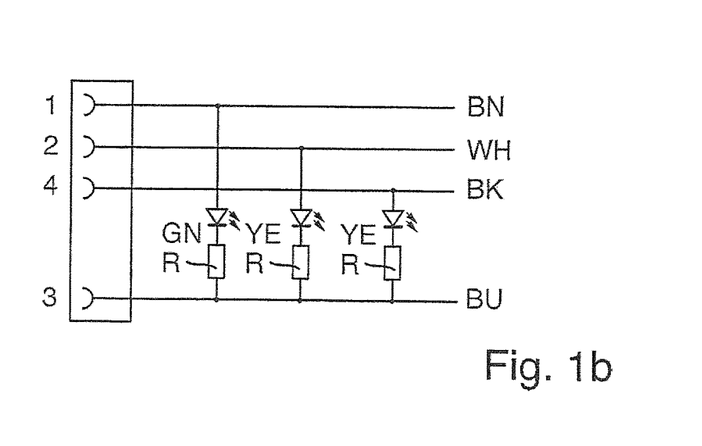
FIG. 1b the contact assignment of a known connection plug M12 with three integrated LEDs.

A circuit for operating the three LEDs gn, ye, ye arranged in the connection plug M12 is shown in FIG. 1b: In each of the three lines, in each case, an LED gn, ye, ye is arranged with a limiting resistor R for electrical current limiting. The LED gn, which displays the operational readiness of the field device, lights in green color gn, while the two LEDs ye, ye, which display the switch outputs MIN, MAX, light in yellow color.

FIG. 1b shows the contact assignment of a known connection plug M12 with three integrated LEDs gn ye, ye.

Figure 2:
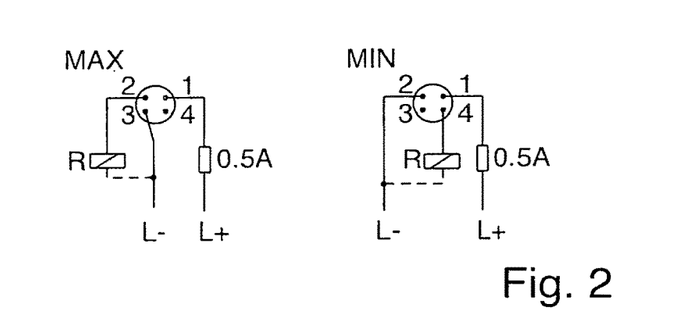
FIG. 2 the contacting of a known connection plug M12, when two switch outputs are present.

FIG. 2 shows the contacting of a known M12 plug, when two switch outputs MIN, MAX are present. Especially shown in FIG. 2 are the different connection types for the MIN and MAX safety switch outputs MIN, MAX as well as the PIN and color assignments of the connection plug M12 and the lines.

Figure 3:
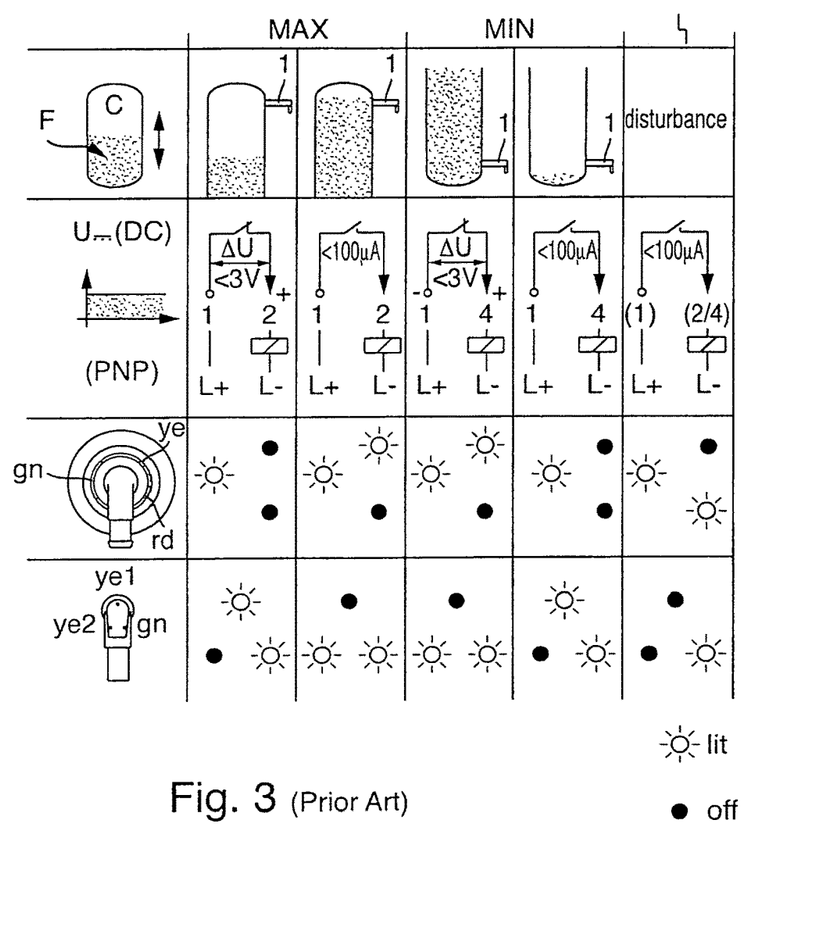
FIG. 3 a schematic representation of different safety functions of a known limit switch.

FIG. 3 shows a schematic representation of different safety functions of a limit switch 1 as well as a representation of the known connection plug M12 plug with three LEDs gn ye, ye. The connection plug M12 includes four lines: a line for the supply voltage, a line for the ground connection GND, a MIN safety switch output and a MAX safety switch output. FIG. 3 visualizes the functioning of the LEDs gn ye, ye known from the state of the art in the case of the different safety functions: Maximum fill level is reached and minimum fill level is reached. Shown in the uppermost row are the possible fill levels in a container C. The fill level F in the container C changes. In the case of application of a limit level switch 1 as overfilling preventer, the limit level switch 1 is mounted at the height of the maximum allowable fill level. In the case of application of the limit level switch 1 as running dry protection for pumps, the limit level switch 1 is positioned at the height of the minimum allowable fill level. In the second row of FIG. 3, the corresponding circuits of the limit level detector 1 are shown. In the third row and the fourth row of FIG. 3, the display elements LED gn ye, ye are shown, which, depending on switch output MIN, MAX light up or are deactivated: In the third row, the LEDs gn ye, ye are integrated in the field device, while in the fourth row they are integrated in the connection plug M12 for the field device.

Figure 4:
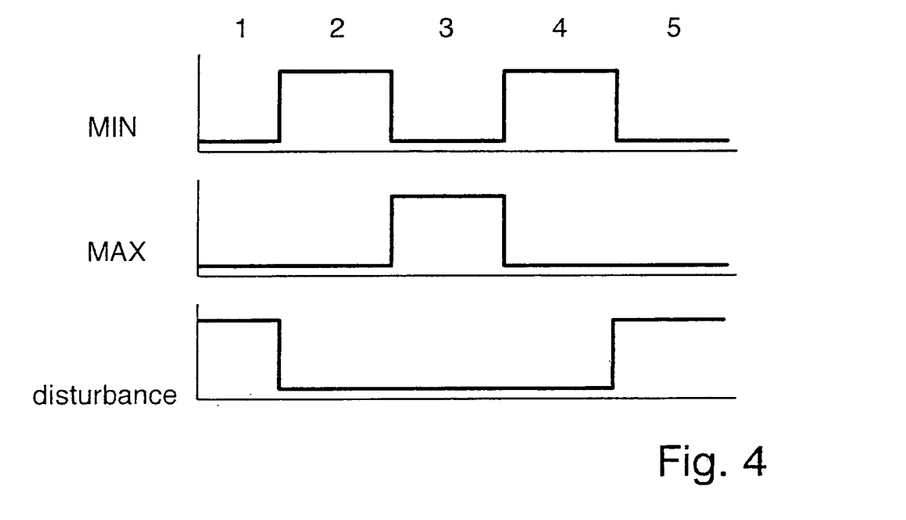
FIG. 4 the levels on the switch outputs of a limit level switch.
Figure 5:
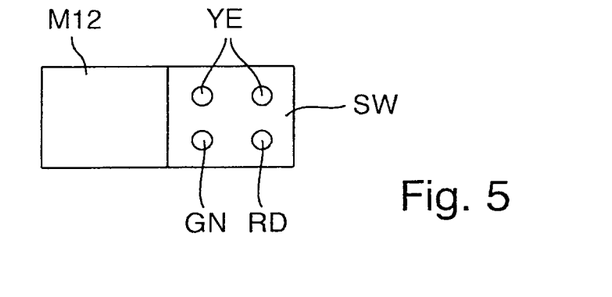
FIG. 5 a plan view onto an embodiment of the plug connector of the invention in schematic representation.

FIG. 4 shows the levels in the case of a limit level switch 1 with two safety switch outputs MIN, MAX according to the invention. FIG. 5 shows a plan view onto an embodiment of the connection plug M12 of the plug connector of the invention with the transparent window SW and four LEDs gn ye, ye, rd.

When the limit level switch 1 correctly functions and outputs the level 1—this is the case in the time ranges characterized with 2, 3 and 4 in FIG. 4—, then one of the two yellow LEDs ye, ye lights. A case of malfunction is present, when the two safety switch outputs MIN, MAX are simultaneously at level 0 and, thus, none of the two yellow LEDs lights up. In this case, a disturbance is signaled by turn-on of the red LED rd.

Figure 6A:
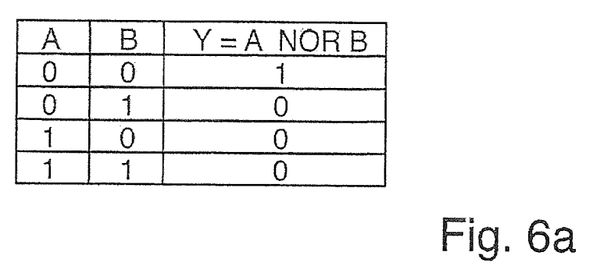
FIG. 6a a representation of a truth table for a NOR circuit.
Figure 6B:
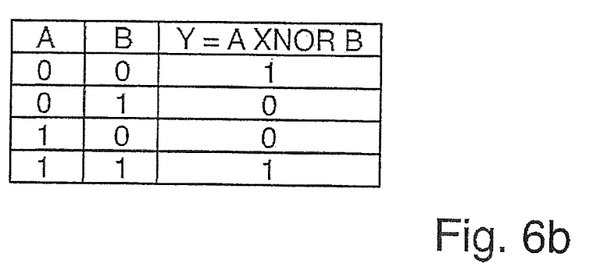
FIG. 6b a representation of a truth table for an XNOR circuit.

FIG. 6a shows a truth table for a NOR circuit and FIG. 6b shows a truth table for a XNOR circuit. The four LEDs gn ye, ye, rd can be connected in the manner of the invention via corresponding logic circuits NOR, XNOR. A designates, for example, the switch output MIN, then B designates the switch output MAX. In the case of the NOR circuit, an alarm set is, respectively the red LED rd is activated, when the two switch outputs MIN, MAX are at level 0. In the case of the XNOR circuit, the red LED rd is supplementally activated, when the switch outputs MIN, MAX are simultaneously at the level 1. As already earlier mentioned, the XNOR circuit is the safer variant, because also the state, in which the two antivalent switch outputs MIN and MAX are simultaneously at the level 1, is not a normal operating state, but, instead, representative of a disturbance or malfunction. However, conventional implementations of these circuits in the case of connector plugs M12 for field devices with small dimensions are not practical. It suffices, in such case, to signal the first mentioned case of malfunction.

Figure 7A:
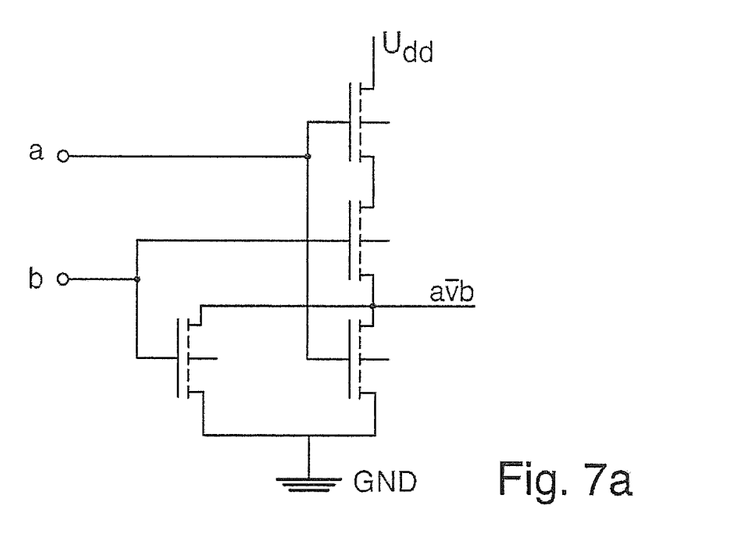
FIG. 7a a representation of a logic, CMOS based, NOR gate.
Figure 7B:
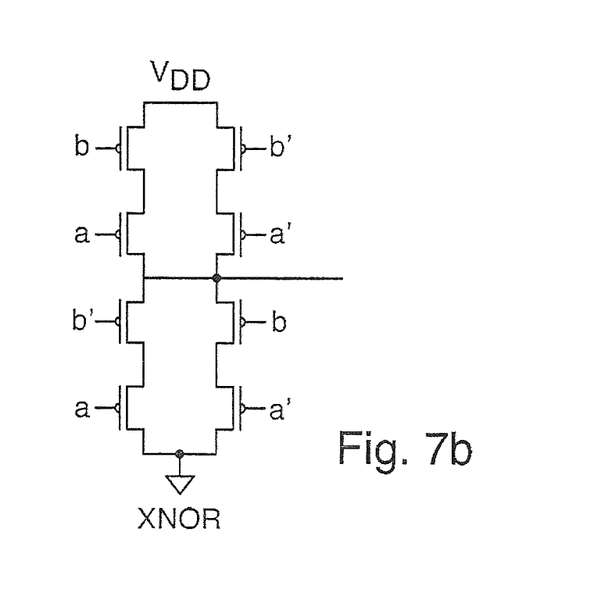
FIG. 7b a representation of a logic, CMOS based, XNOR gate.

FIG. 7a shows a representation of a logic NOR gate based on CMOS technology; FIG. 7b shows a logic XNOR gate based on CMOS technology. The plug connector of the invention can be implemented with these two logic gates NOR, XNOR.

Figure 8:
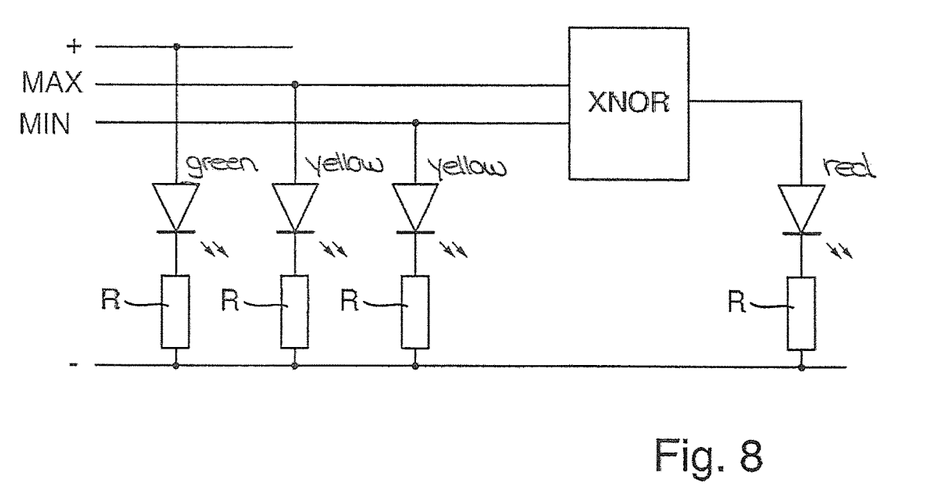
FIG. 8 an advantageous embodiment of the plug connector of the invention using a logic gate.

FIG. 8 shows an advantageous embodiment of the plug connector of the invention with a logic gate XNOR for switching the switch outputs MIN, MAX of a limit level switch 1. Via the logic gate XNOR, the red LED rd is activated, as soon as the two switch outputs MIN, MAX of the limit level switch are at the same level 0 or 1. The green LED gn lights, when the field device is supplied with voltage. Associated with each of the LEDs gn ye, ye, rd is a limiting resistor R for electrical current limiting. The shown circuit is best suitable for implementing the solution of the invention. However, no standard components are currently market obtainable, which are suitable for input voltages to 24V or more. This voltage range is the nominal range for applications in automation technology and must by all means be covered. Moreover, it is for application of the solution of the invention in a limit level switch 1 unavoidable that an integrated chip with small size must be used, since the available space in the connection plug M12 is limited.

Figure 9:
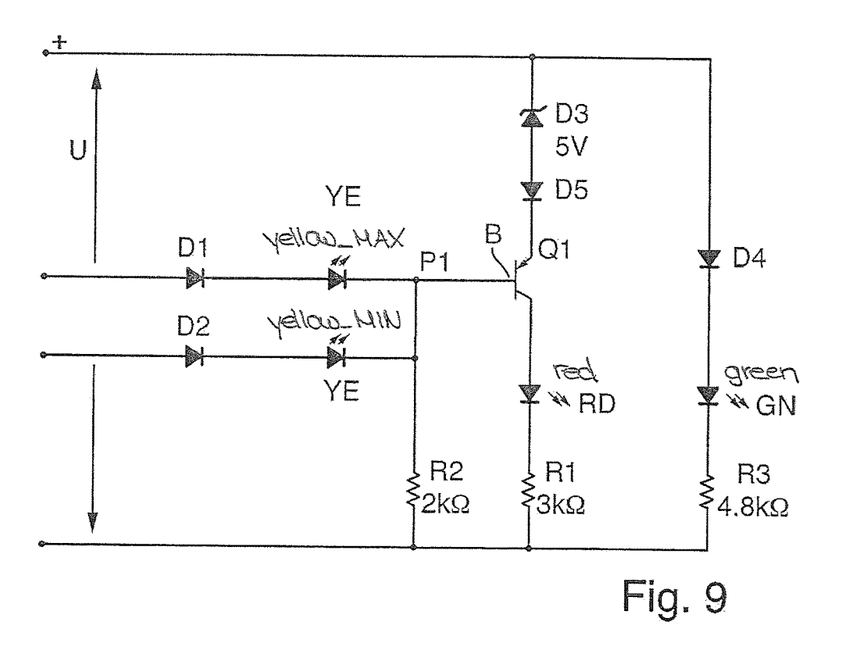
FIG. 9 a circuit diagram of a first preferred electrical circuit for circuitry of the display elements of the plug connector of the invention.

FIG. 9 shows a circuit diagram of a preferred electrical circuit for interconnecting the LEDs gn ye, ye, rd of the plug connector of the invention. The shown circuit requires few switch elements and can be implemented also in the case of little available space, so that it can also be accommodated in a connection plug M12. Associated with each LED gn ye, ye, rd is a diode D1, D2, D4, D5 as overvoltage protection and protection against wrong connections. In given cases, the protective diodes D1, D2, D4, D5 associated with the LEDs gn ye, ye, rd may not necessary and can be omitted.

Installed in the circuit is a transistor Q1, here a PNP transistor, which conducts, as soon as the voltage on the base B subceeds a predetermined voltage value. In normal operation, i.e. so long as either the switch output MIN or the switch output MAX is at level 1, the circuit point P1 is located at a high potential and the transistor Q1 blocks electrical current flow. As a result, the red LED rd remains deactivated. To be noted is that, due to the end stages of the DC PNP switch outputs MIN, MAX and due to the protective diodes D1, D2 as well as the LEDs ye, ye, it is not the supply voltage U that lies on the circuit point P, but, instead, a voltage lessened by the respective voltage drops. In order to assure that the PNP transistor Q1 safely blocks, when only one of the two switch outputs MIN, MAX is switched, a Zener diode D3 is used. Since the transistor Q1 blocks, the red LED rd displaying a disturbance or malfunction is not activated.

Figure 10:
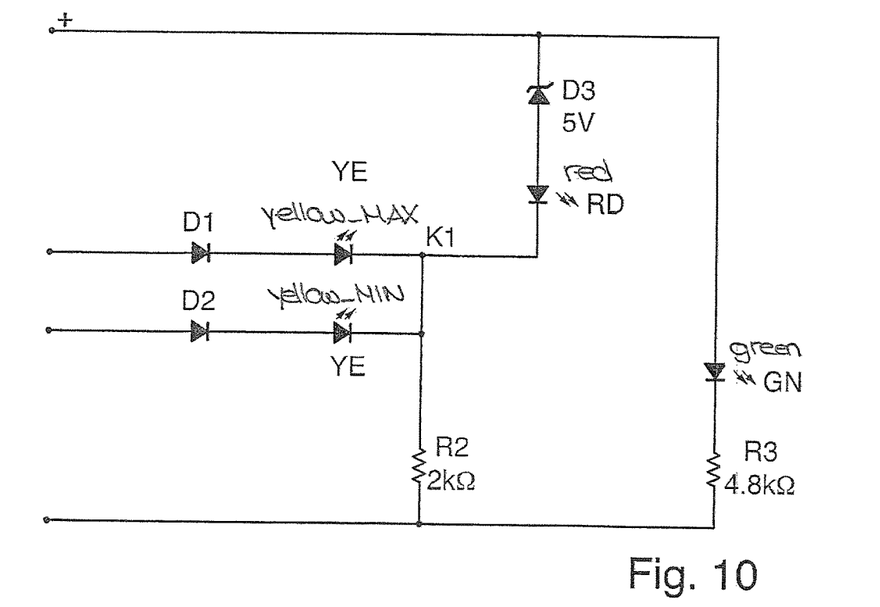
FIG. 10 a circuit diagram of a second preferred electrical circuit for circuitry of the display elements of the plug connector of the invention.

A cost- and space optimized implementation of the invention is shown in FIG. 10. In this implementation, both the PNP transistor Q1 as well as also three other components are omitted. The circuit otherwise functions in the same way as the circuit of FIG. 9. If one of the two switch outputs MIN, MAX is switched on and, thus, at level 1, one of the two yellow LEDs ye, ye illuminates and lifts the potential at the node point K1. The red LED rd indicating a disturbance or malfunction does not light, since there is no positive voltage between the node point K1 and the anode of the red LED rd. This is likewise assured by a Zener-diode D3.

If the two switch outputs MIN, MAX are blocked, a small potential lies on the node point K1. Thus, a voltage is present on the red LED rd, and it lights, in order to signal the disturbance or malfunction. In an advantageous embodiment, space requirement and costs can yet further be reduced by omitting the protective diodes D1, D2 in front of the LEDs ye, ye.

The invention claimed is:

1. A plug connector for connecting a field device of automation technology to an energy supply and/or to an evaluation unit, comprising:
   a connection plug for the field device, wherein said field device has two antivalent switch outputs respectively indicating a current switch state of the field device, and the connection plug is composed, at least partially, of a transparent material; and
   at least four display elements, including a first display element, a second display element, a third display element, and a fourth display element, arranged in said connection plug, wherein:
      the first display element is connected to indicate operational readiness of the field device;
      the second display element and the third display element are respectively connected to indicate states of the two antivalent switch outputs of the field device, wherein when no disturbance or malfunction occurs, the second display element indicates that a first one of the two antivalent switch outputs of the field device is in a first state and the third display element indicates that a second one of the two antivalent switch outputs of the field device is in a second state such that the antivalent switch outputs are in different states, and
      wherein when a disturbance or malfunction occurs, the second and third display elements indicate that the two antivalent switch outputs are in a same state;
      the fourth display element is connected to the two antivalent switch outputs by a NOR or XNOR logic circuit to signal a disturbance or malfunction of the field device; and
   wherein the logic circuit is so embodied that a disturbance or malfunction of the field device is detected based on said antivalent switch outputs of the field device wherein in case that a disturbance or malfunction is detected, said fourth display element is also activated to provide a further indication that the two antivalent switch outputs are in the same state and that a disturbance or malfunction o the field device has occurred.

2. The plug connector as claimed in claim 1, wherein: said logic circuit is implemented in CMOS technology.

3. The plug connector as claimed in claim 1, wherein: said logic circuit is implemented with an integrated gate.

4. The plug connector as claimed in claim 1, wherein: said logic circuit is implemented in an integrated circuit chip.

5. The plug connector as claimed in claim 1, wherein: said logic circuit comprises a switch element, which is so embodied that in the case of occurrence of a disturbance or malfunction, which is detected based on said connected antivalent switch outputs, it activates said fourth display element, which is connected downstream.

6. The plug connector as claimed in claim 5, wherein:
said switch element is a bipolar transistor, especially a PNP transistor, in whose base branch said second display element and said third display element are connected in parallel and in whose collector branch said fourth display element is arranged; and
aid bipolar transistor is so embodied that it blocks in normal operation and conducts in the case of occurrence of a disturbance or malfunction.

7. The plug connector as claimed in claim 1, wherein:
said logic circuit is so embodied that said second display element and said third display element are connected in parallel and said fourth display element is connected in series with said second display element and said third display element, that in normal operation the voltage lying on a node between said two parallel connected display elements and said fourth display element is low that said fourth display element is deactivated, and that in the case of occurrence of a disturbance or malfunction the potential on the node is high that said fourth display element is activated.

8. The plug connector as claimed in claim 1, wherein:
said display elements are light-emitting diodes;
    the first light-emitting diode lights in a first color, preferably in green color, and characterizes the operating state of the field device;
    the second and third light-emitting diodes light in a second color, preferably in yellow color, and display said two antivalent switch outputs; and
    the fourth light-emitting diode lights in a third color, preferably in red color, and signals disturbance- and/or malfunction.

9. The plug connector as claimed in claim 8, further comprising:
    a Zener diode at least in an anode branch of said fourth light-emitting diode.

* * * * *